(12) United States Patent  
Liang et al.

(10) Patent No.: US 9,246,053 B2  
(45) Date of Patent: Jan. 26, 2016

(54) LIGHT-EMITTING DEVICE AND FABRICATION METHOD THEREOF

(71) Applicant: XIAMEN SANAN OPTOELECTRONICS TECHNOLOGY CO., LTD., Xiamen (CN)

(72) Inventors: Xinghua Liang, Xiamen (CN); Te-Ling Hsia, Xiamen (CN); Chenke Hsu, Xiamen (CN); Chih-Wei Chao, Xiamen (CN); Shuiqing Li, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 14/748,516

(22) Filed: Jun. 24, 2015

(65) Prior Publication Data  
US 2015/0295130 A1   Oct. 15, 2015

Related U.S. Application Data

(63) Continuation of application No. PCT/CN2014/071060, filed on Jan. 22, 2014.

(30) Foreign Application Priority Data

May 23, 2013 (CN) .......................... 2013 1 0193631

(51) Int. Cl.  
*H01L 33/00* (2010.01)  
*H01L 33/02* (2010.01)  
*H01L 33/14* (2010.01)  
*H01L 33/10* (2010.01)

(52) U.S. Cl.  
CPC .......... *H01L 33/145* (2013.01); *H01L 33/0095* (2013.01); *H01L 33/025* (2013.01); *H01L 33/10* (2013.01); *H01L 33/0079* (2013.01)

(58) Field of Classification Search  
None  
See application file for complete search history.

(56) References Cited

U.S. PATENT DOCUMENTS

| 8,415,702 | B2 | 4/2013 | Pan et al. | |
|---|---|---|---|---|
| 2007/0065959 | A1* | 3/2007 | Chang | H01L 33/02 438/31 |
| 2009/0023239 | A1* | 1/2009 | Erchak | G03B 21/204 438/34 |
| 2010/0181576 | A1 | 7/2010 | Wuu et al. | |
| 2011/0217803 | A1* | 9/2011 | Nihei | H01L 33/32 438/46 |
| 2012/0288995 | A1* | 11/2012 | El-Ghoroury | H01L 27/14618 438/107 |
| 2014/0370695 | A1 | 12/2014 | Kononchuk et al. | |

* cited by examiner

*Primary Examiner* — William Coleman  
*Assistant Examiner* — Kien Ly  
(74) *Attorney, Agent, or Firm* — Syncoda LLC; Feng Ma

(57) ABSTRACT

A light-emitting device of little aging electric leakage and high luminous efficiency and fabrication thereof, in which, the light-emitting device includes: a semiconductor epitaxial laminated layer that comprises an N-type semiconductor layer, a P-type semiconductor layer and a light-emitting layer between the N-type semiconductor layer and the P-type semiconductor layer, the surface of which has deflected dislocation; electromigration resistant metal that fills into the deflected dislocation over the N-type or/and P-type semiconductor layer surface through pretreatment to block the electromigration channel formed over the semiconductor epitaxial laminated layer due to deflected dislocation to eliminate electric leakage.

18 Claims, 15 Drawing Sheets

LIGHT-EMITTING DEVICE AND FABRICATION METHOD THEREOF

CROSS-REFERENCE TO RELATED APPLICATIONS

The present application is a continuation of, and claims priority to, PCT/CN2014/071060 filed on Jan. 22, 2014, which claims priority to Chinese Patent Application No. 201310193631.5 filed on May 23, 2013. The disclosures of these applications are hereby incorporated by reference in their entirety.

BACKGROUND

A light emitting diode (LED) is a semiconductor light-emitting device, which is widely applied in display or lighting field like indicator light and display screen for its environmental performance, high luminance, low power consumption, long service life, low working voltage and easy integration. White light LED has become the fourth-generation new lighting source following incandescent lamp, fluorescent lamp and high intensity discharge lamp (e.g., HPSL).

In the past few years, thanks to material and technology breakthroughs, luminance of white light LED is greatly improved and its lighting effect is completely outperformed over the fluorescent lamp. However, high initial purchase price of the LED—about two times of that of the fluorescent lamp—has restricted its popular application in lighting. Only after long-time service, comprehensive cost of the LED is lower than that of the fluorescent lamp when power-saving cost and replacement cost are considered. And power-saving effect of LED is not recognized by the public for its actual service time is usually shorter than theoretical time. In particular, during long-time service of high-power chip, aging electric leakage always restricts long time service of the LED.

SUMMARY

The present disclosure provides a light-emitting device of little aging electric leakage and high luminous efficiency and fabrication thereof.

According to a first aspect of present disclosure, a light emitting diode is provided, comprising, a semiconductor epitaxial laminated layer that comprises an N-type semiconductor layer, a P-type semiconductor layer and a light-emitting layer between the N-type semiconductor layer and the P-type semiconductor layer, the surface of which has deflected dislocation; electromigration resistant metal that fills into the deflected dislocation over the N-type or/and P-type semiconductor layer surface to block the electromigration channel formed over the semiconductor epitaxial laminated layer due to deflected dislocation to eliminate electric leakage.

In the present disclosure, electromigration resistant metal is applied to block the deflected dislocation and to prevent the easy-migrating metal (e.g., Ag, Al, Sn) in the reflector or the welding layer from electromigration due to deflected dislocation in electric field, thereby eliminating aging electric leakage due to electromigration. Further, the electromigration resistant metal fills into the deflected dislocation over the semiconductor epitaxial laminated layer surface to increase adhesiveness of the semiconductor epitaxial laminated layer to the metal material layer.

Specifically, the electromigration resistant metal fills into at least one surface of the N-type or the P-type semiconductor layer, instead of penetrating the entire semiconductor epitaxial laminated layer.

Preferably, the electromigration resistant metal is only located in the deflected dislocation over the semiconductor epitaxial laminated layer surface to reduce light absorption as much as possible.

Preferably, the electromigration resistant metal fills into the deflected dislocation over the N-type or/and the P-type semiconductor layer surface by applying voltage or heating.

Preferably, the electromigration resistant metal is made of metal comprising Cu, Au, Pt, Pd, W, Mo, Ta, Nb or V or alloy from any of their combinations.

In some embodiments, the light-emitting device also comprises a reflective mirror layer, formed over the semiconductor epitaxial laminated layer through a bonding layer, and the deflected dislocation over the surface of the semiconductor epitaxial laminated layer at the side that is approximate to the reflective mirror layer is filled with the electromigration resistant metal. Preferably, the reflective mirror layer is made of Ag or Al or their alloy, and the bonding layer is made of Ni, Cr or Ti or alloy from any of their combinations. Before forming of a metal reflector, the metal filled into the deflected dislocation over the semiconductor laminated layer surface can reduce thickness of the bonding layer for mirror formation, thereby reducing cost, eliminating light absorption, increasing light emitting of the light-emitting device and reducing ohmic contact resistance.

In some embodiments, the light-emitting device also comprises a solder layer for bonding the semiconductor epitaxial laminated layer to a base, and the deflected dislocation over the surface of the semiconductor epitaxial laminated layer at the side that is approximate to the solder layer is filled with the electromigration resistant metal. Preferably, the welding layer is made of Ti, Al, Ni, Cr or Sn or alloy from any of their combinations.

The light-emitting device can be vertical structure or flip-chip structure. In some embodiments, a vertical light-emitting device, comprising a substrate; a reflective mirror layer over the substrate; a bonding layer over the reflective mirror layer; a semiconductor epitaxial laminated layer over the bonding layer, comprising an N-type semiconductor layer, a P-type semiconductor layer and a light-emitting layer between the N-type and the P-type semiconductor layer, the surface of which has deflected dislocation; and electromigration resistant metal that is filled into the deflected dislocation over the surface of the semiconductor laminated layer at the side that is approximate to the reflective mirror layer through pre-applied diffusion driving force.

According to a second aspect of the present disclosure, a fabrication method of the light-emitting device is provided, comprising:

Step 1, a semiconductor epitaxial laminated layer is provided, comprising an N-type semiconductor layer, a P-type semiconductor layer and a light-emitting layer between the N-type semiconductor layer and the P-type semiconductor layer, the surface of which has deflected dislocation;

Step 2, electromigration resistant metal is filled into the deflected dislocation over the N-type or/and P-type semiconductor layer surface to block the electromigration channel formed over the semiconductor epitaxial laminated layer due to deflected dislocation to eliminate electric leakage.

In some embodiments, the electromigration resistant metal is filled into the deflected dislocation over the semiconductor epitaxial laminated layer surface through heating and fusing. Preferably, heating and fusing temperature is higher than 400° C.

In some embodiments, the electromigration resistant metal is diffused to the deflected dislocation over the semiconductor epitaxial laminated layer surface by applying voltage to both ends of the semiconductor epitaxial laminated layer. Preferably, the voltage is higher than 100 V.

In some embodiments, Step 2 specifically comprises: exposing at least one surface of the N-type or the P-type semiconductor layer of the semiconductor epitaxial laminated layer, over which, forming an electromigration resistant metal blocking layer; applying force on the metal blocking layer to fill the electromigration resistant metal of the metal blocking layer into the deflected dislocation of the semiconductor surface; removing the metal blocking layer and retaining the electromigration resistant metal in the deflected dislocation and exposing the semiconductor surface, in which, the metal blocking layer can be formed through evaporating, sputtering or vapor deposition and then the metal blocking layer can be removed through wet etching. Preferably, the metal etching liquid is applied in wet etching till the semiconductor layer surface is just exposed yet metal in the deflected dislocation is retained.

Taking fabrication of the vertical light-emitting device as example, comprising: 1) providing a semiconductor epitaxial laminated layer, comprising an N-type semiconductor layer, a P-type semiconductor layer and a light-emitting layer between the N-type semiconductor layer and the P-type semiconductor layer; 2) exposing at least one surface of the N-type or the P-type semiconductor layer of the semiconductor layer; 3) pre-forming an electromigration resistant metal blocking layer over the about-to-be-formed semiconductor surface of the reflective mirror layer; 4) applying force on the metal blocking layer to fill the electromigration resistant metal into the deflected dislocation over the semiconductor epitaxial laminated layer surface; 5) removing the metal blocking layer and retaining the electromigration resistant metal in the deflected dislocation and exposing the semiconductor epitaxial laminated layer surface for depositing the reflective mirror layer; 6) forming a bonding layer over the semiconductor surface; 7) forming a mirror layer over the semiconductor surface; 8) bonding the conductive substrate over the mirror layer; and 9) fabricating one electrode under the substrate and fabricating the other electrode over the semiconductor layer.

Figure 1:
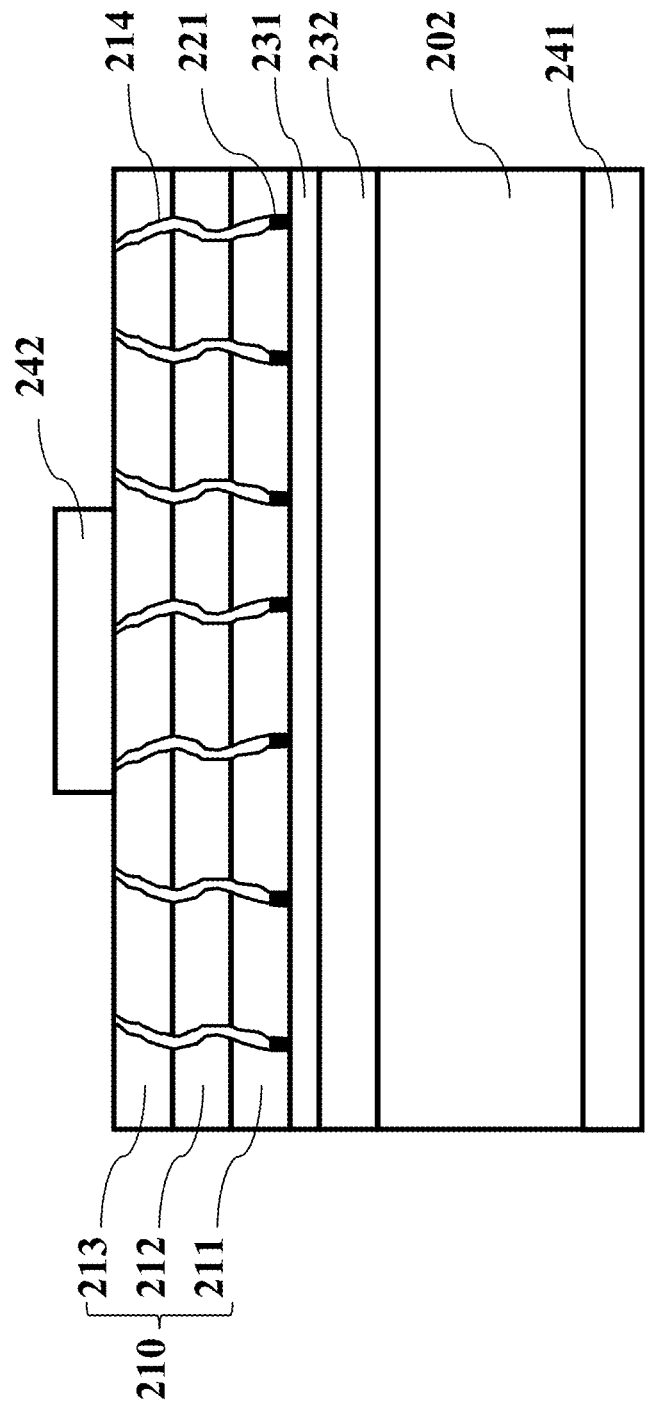
FIG. 1 a structural section view according to Embodiment 1 of the present disclosure.

In the drawings:
101, 201, 301: growth substrate;
102, 202, 302, 402: conductive substrate;
110, 210, 310, 410: semiconductor epitaxial laminated layer;
111, 211, 311, 411: P-type semiconductor layer;
112, 212, 312, 412: light-emitting layer;
113, 213, 313, 413: N-type semiconductor layer;
114, 214, 314, 414: deflected dislocation;
220: metal blocking layer;
221, 321, 421: anti-diffusion metal;
131, 231, 331: bonding layer;
132, 232, 332: mirror layer;
141, 241, 341, 441: P electrode;
142, 242, 342, 442: N electrode;
302a, 302b: P, N welding points;
450: solder layer.

DETAILED DESCRIPTION

The high-power LED chip generally adopts vertical or flip-chip structure that normally uses Ag/Al material as the reflector, which are vulnerable to electromigration due to the deflected dislocation of chip under high current density, thus leading to short circuit and failure. Therefore, it is necessary to block these electromigration channels to eliminate electric leakage, thus increasing LED reliability and extending service life. The core idea of the embodiments below is to fill the electromigration resistant metal into the deflected dislocation over the semiconductor surface to prevent easy-migrating metal material from electromigration due to deflected dislocation in electric field, thereby eliminating aging electric leakage due to electromigration.

Embodiment 1

With reference to FIG. 1, the section view of a vertical LED light-emitting device, comprising a semiconductor epitaxial laminated layer 210, a mirror layer 231 and a conductive substrate 202, in which, the conductive substrate 202 is used for supporting the semiconductor epitaxial laminated layer 210 and the mirror layer 231 is located between the conductive substrate 202 and the semiconductor epitaxial laminated layer 210.

Specifically, the semiconductor epitaxial laminated layer 210 at least comprises a P-type semiconductor layer 211, a light-emitting layer 212 and an N-type semiconductor layer 213, which can be made of GaN-based, AlGaInP or other materials. A series of deflected dislocations 214 appear due to incomplete lattice match between the semiconductor epitaxial laminated layer 210 and the growth substrate. Anti-diffusion metal 221 is filled into the dislocation over the P-type semiconductor layer 211 surface, which may be applied with force in advance by heating and fusing or applying voltage at both ends of the P-type semiconductor layer 211 and the N-type semiconductor layer 213. Electromigration resistant metal 214 is only filled into the deflected dislocation over the P-type semiconductor layer surface and removed from other regions without penetrating the entire semiconductor epitaxial laminated layer 210 for it generally may absorb light emitted from the light-emitting layer. The electromigration resistant metal 214 is made of low-electromigration Cu, Au, Pt, Pd, W, Mo, Ta, Nb or V or alloy from any of their combinations. The bonding layer 231, made of Ni, Cr or Ti or alloy from any of their combinations, either in single-layer structure or multi-layer structure, is formed over the P-type semiconductor layer surface. The mirror layer 232, made of Ag, Al or their alloy, is connected to the P-type semiconductor layer via the bonding layer 231. The conductive substrate can be Si substrate or other metal substrates.

In this embodiment, the electromigration resistant metal 214 is filled into the deflected dislocation of the contact layer (i.e., the P-type semiconductor layer surface) between the semiconductor epitaxial laminated layer 210 and the mirror layer 232 to block the electromigration channel due to deflected dislocation in the semiconductor epitaxial laminated layer, which effectively prevents easy-migrating metal (e.g., Ag, Al) from electromigration due to deflected dislocation in electric field, thereby eliminating aging electric leakage due to electromigration.

In this embodiment, the metal is filled into the deflected dislocation over the P-type semiconductor layer surface. Before mirror evaporating process, the bonding layer metal may not be used or be used as little as possible to save cost. At the same time, since the bonding layer metal usually absorbs light, decreasing its thickness will improve light emitting. In addition, the metal filled into the deflected dislocation provides a better ohmic contact between the electrode and the semiconductor, which effectively improves chip luminous efficiency.

Figure 2:
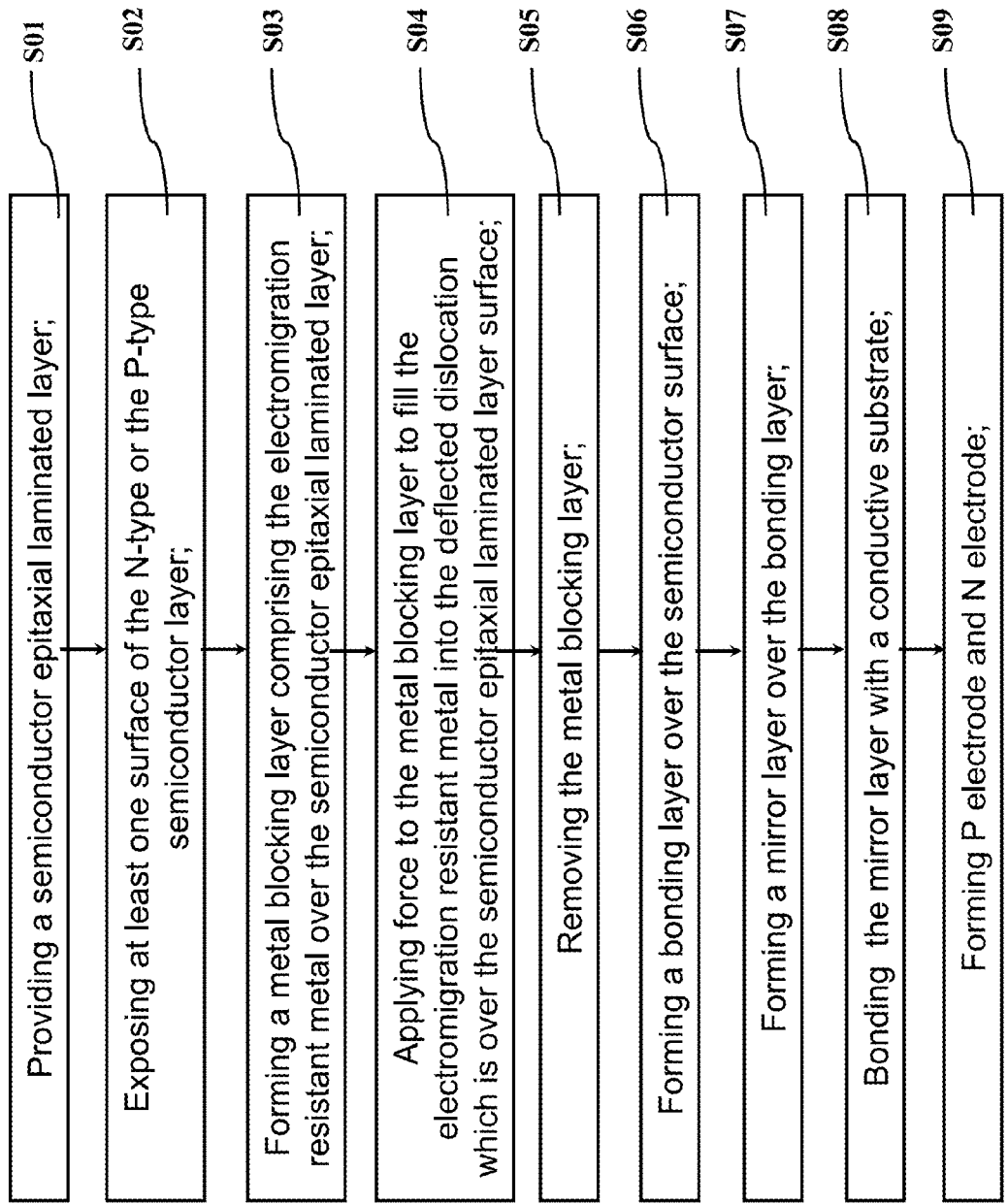
FIG. 2 is a flow diagram of fabrication method of the light-emitting device according to Embodiment 1 of the present disclosure.

FIG. 2 is a flow diagram of a fabrication method of a vertical LED light-emitting device according to this embodiment.

Figure 3:
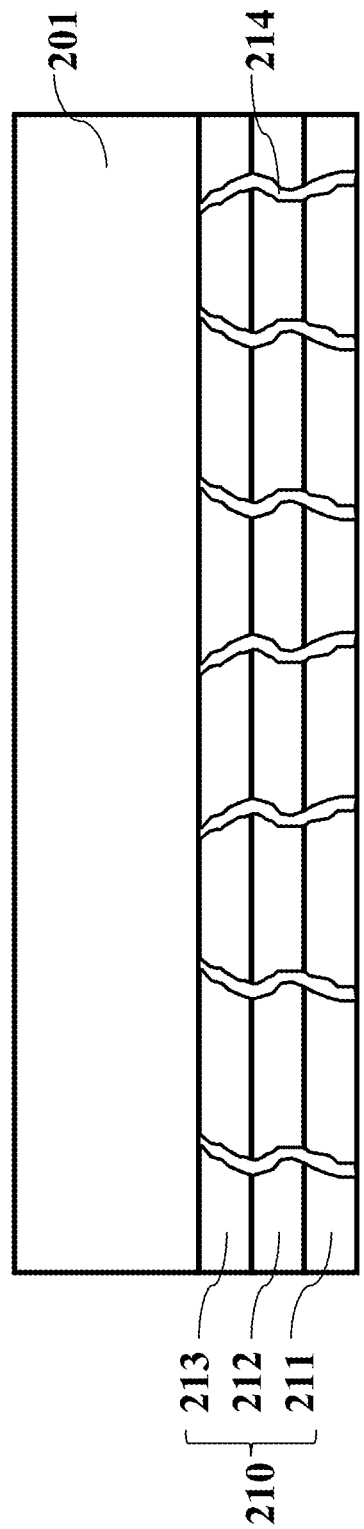
FIG. 3 is a sectional view of a first step of fabrication method of the light-emitting device according to Embodiment 1 of the present disclosure.

Step S01: a semiconductor epitaxial laminated layer is provided, comprising an N-type semiconductor layer, a P-type semiconductor layer and a light-emitting layer between the N-type semiconductor layer and the P-type semiconductor layer. The semiconductor epitaxial laminated layer can be III-V group compound, II-VI group compound, etc. Preferably, the semiconductor layer is III-V group nitride. As shown in FIG. 3, the nitride semiconductor laminated layer 210, comprising an N-type semiconductor layer 213, a P-type semiconductor layer 211 and a light-emitting layer 212, is formed over the growth substrate 201. A series of deflected dislocation 214 are formed due to incomplete lattice match between the semiconductor epitaxial laminated layer and the growth substrate. Generally, a material layer, e.g., a buffer layer, can be inserted between the growth substrate and the N-type semiconductor layer.

Step S02: at least one surface of the N-type or the P-type semiconductor layer of the semiconductor epitaxial laminated layer is exposed. In this embodiment, the P-type semiconductor layer surface is exposed.

Figure 4:
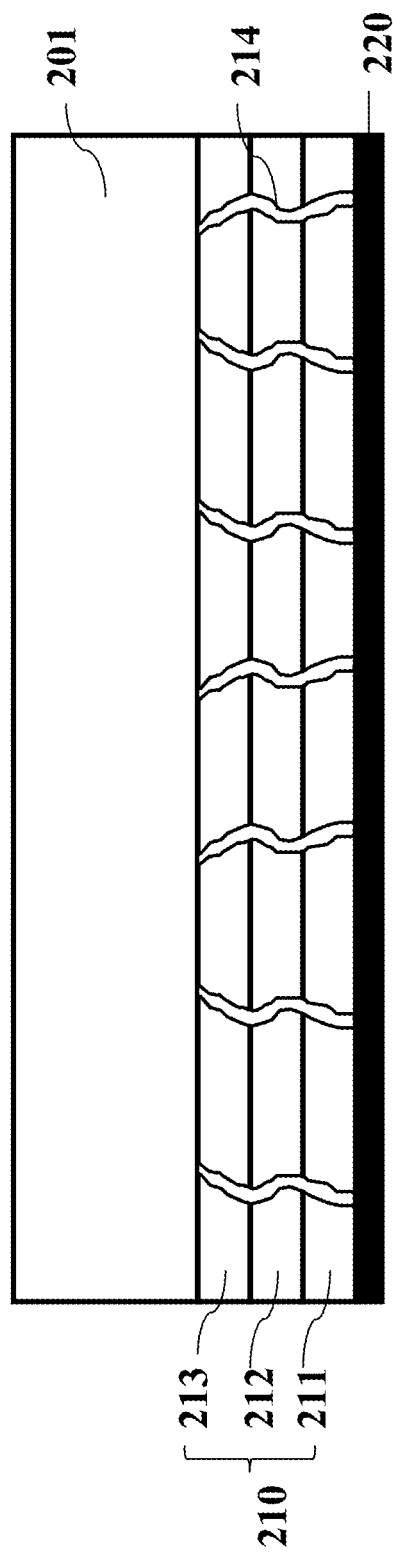
FIG. 4 illustrates a second step.

Step S03: a metal blocking layer comprising electromigration resistant metal is formed over the about-to-be-formed semiconductor epitaxial laminated layer of the reflective mirror layer through evaporating, sputtering or vapor deposition, in which, the electromigration resistant metal is made of low-electromigration material like Cu, Au, Pt, Pd, W, Mo, Ta, Nb or V. In this embodiment, as shown in FIG. 4, preferably, a 100 Å metal blocking layer 220 made of Pt is formed over the P-type semiconductor layer 211 surface through evaporating.

Figure 5:
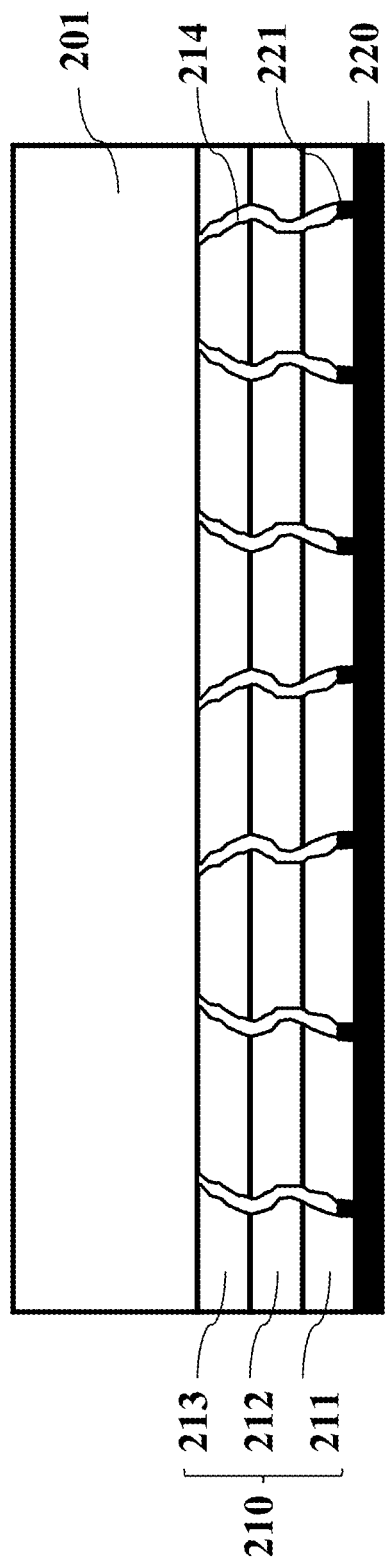
FIG. 5 illustrates a third step.

Step S04: the metal blocking layer 220 is applied with force to fill the electromigration resistant metal into the deflected dislocation over the semiconductor epitaxial laminated layer surface. As shown in FIG. 5, heating and fusing is adopted to increase fluidity of the metal blocking layer 220 under heating conditions, thereby filling the metal atom into the deflected dislocation 214. Preferably, heating and fusing temperature is 430° C. In some embodiments, high voltage is applied at both ends of the semiconductor layer to fill the electromigration resistant metal into the deflected dislocation after minor movement under high electric field. Preferably, the high voltage is 500 V.

Figure 6:
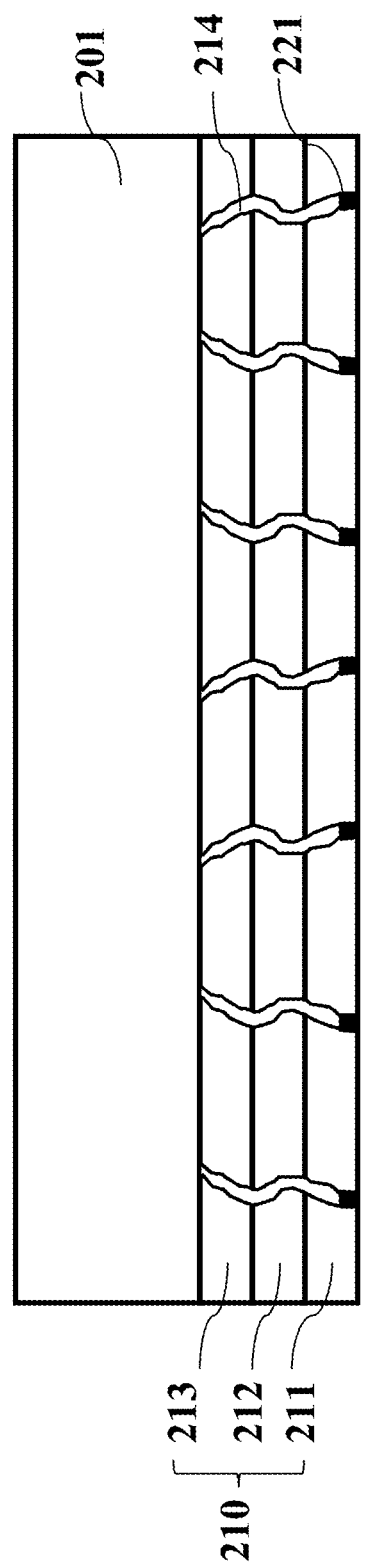
FIG. 6 illustrates a fourth step.

Step S05: the metal blocking layer 220 is removed and the electromigration resistant metal 221 in the deflected dislocation is retained, and the P-type semiconductor layer 211 surface is exposed, as shown in FIG. 6. Specifically, special metal etching liquid is applied in wet etching till the P-type semiconductor layer surface is just exposed yet metal in the deflected dislocation is retained to remove the metal blocking layer. In this embodiment, the etching liquid is aqua regia with adjusted blending ratio and the etching time is about 1 min.

Figure 7:
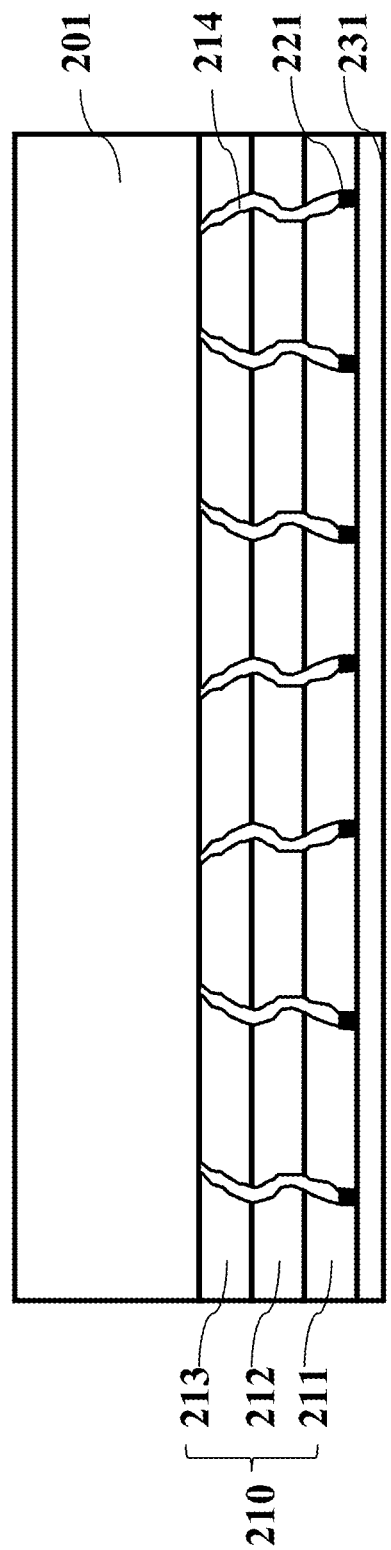
FIG. 7 illustrates a fifth step.

Step S06: a bonding layer 231 is formed over the P-type semiconductor surface, as shown in FIG. 7. The bonding layer 231 is made of Ni, Cr or Ti or alloy from any of their combinations, either in single-layer structure or multi-layer structure.

Figure 8:
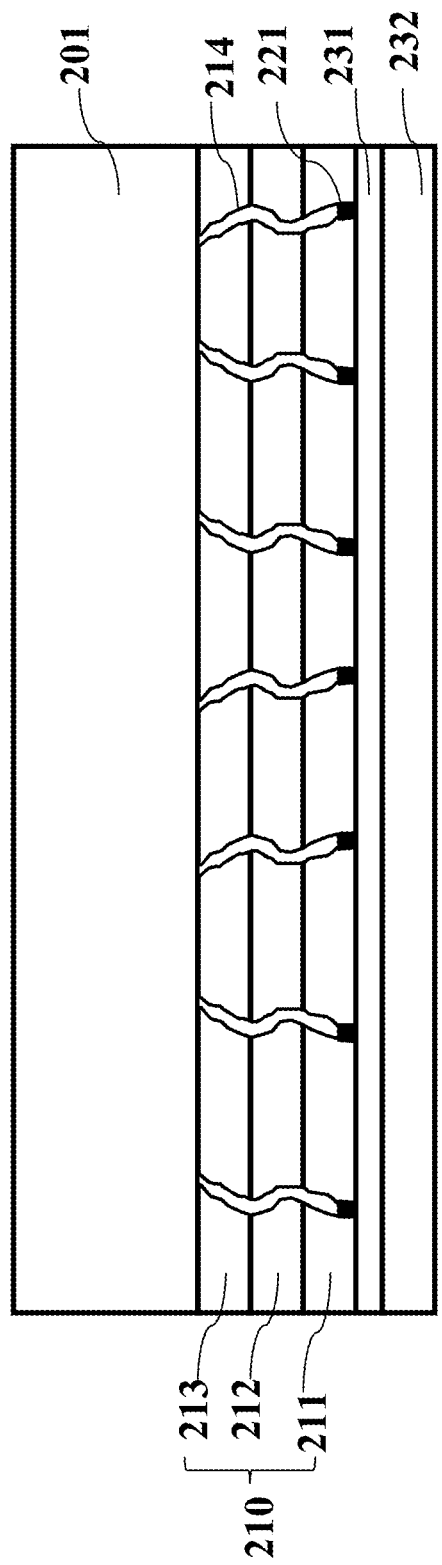
FIG. 8 illustrates a sixth step.

Step S07: a mirror layer 232 is fabricated over the bonding layer 231, as shown in FIG. 8. The mirror layer 232 can be made of Ag, Al or alloy from their combinations.

Figure 9:
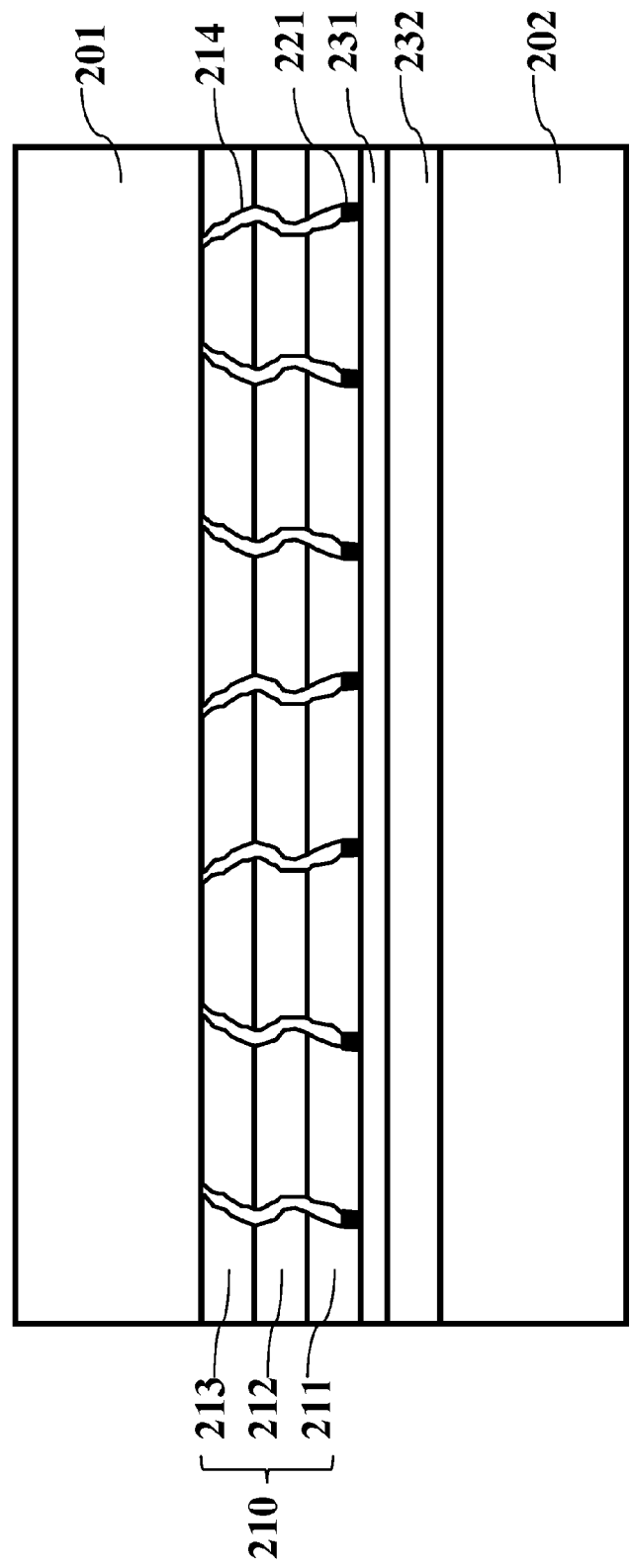
FIG. 9 illustrates a seventh step.

Step S08: the mirror layer 232 is bonded with the conductive substrate 202, as shown in FIG. 9.

Figure 10:
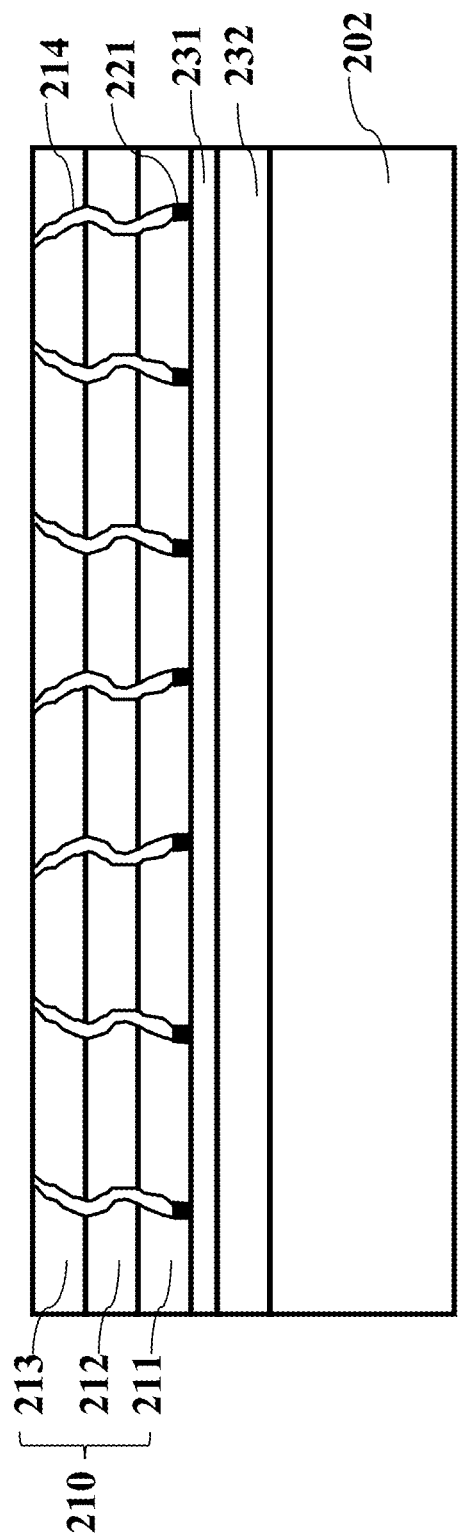
FIG. 10 illustrates an eighth step.
Figure 11:
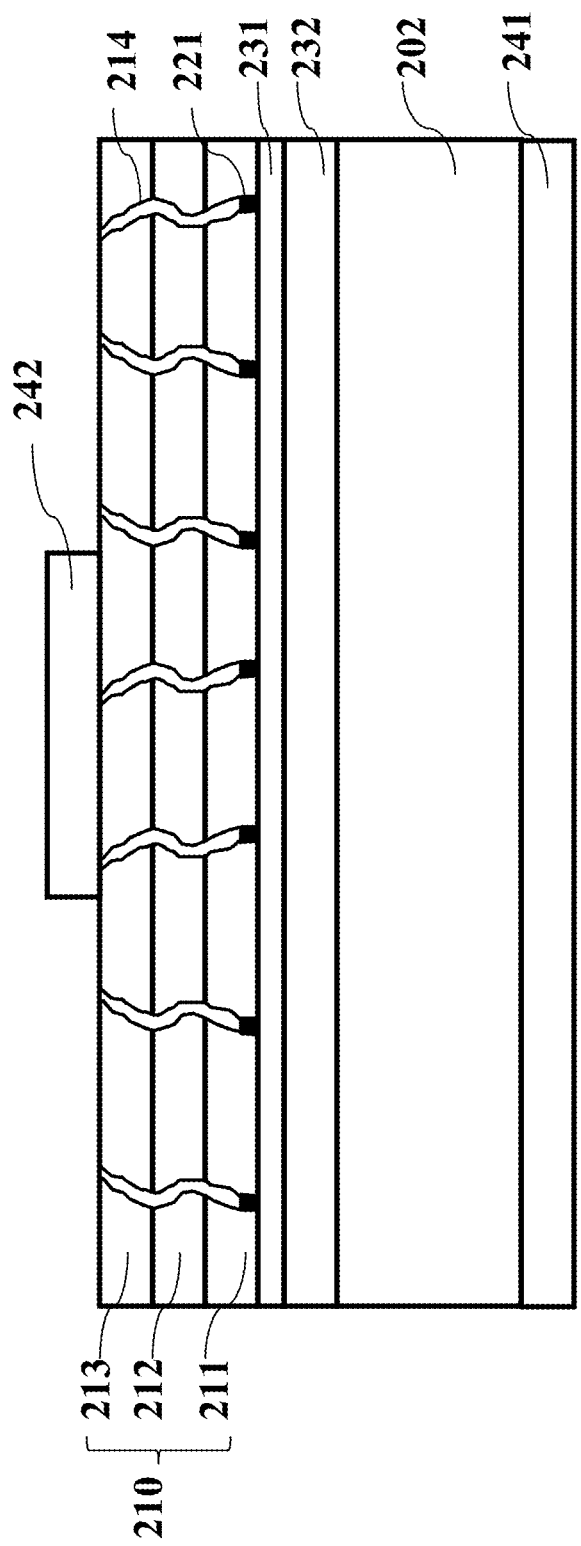
FIG. 11 illustrates a ninth step.

Step S09: P electrode and N electrode 241, 242 are fabricated. Preferably, lifting-off process of the growth substrate is made before electrode fabrication, as shown in FIG. 10. The two electrodes are fabricated respectively after lifting-off, as shown in FIG. 11.

In this embodiment, fill the metal blocking layer into the deflected dislocation over the semiconductor layer surface by applying force in advance and then remove the metal material in the non-deflected dislocation. In this way, light absorption from the metal blocking layer can be eliminated. In addition, materials can be recycled after other processing. The electromigration resistant metal filled into the semiconductor layer surface, on the one hand, blocks easy-migrating metal in the mirror layer from migrating towards the epitaxial layer via the deflected dislocation, which may result in electric leakage. On the other hand, it provides a better ohmic contact between the electrode and the semiconductor, which effectively improves chip luminous efficiency.

Figure 12:
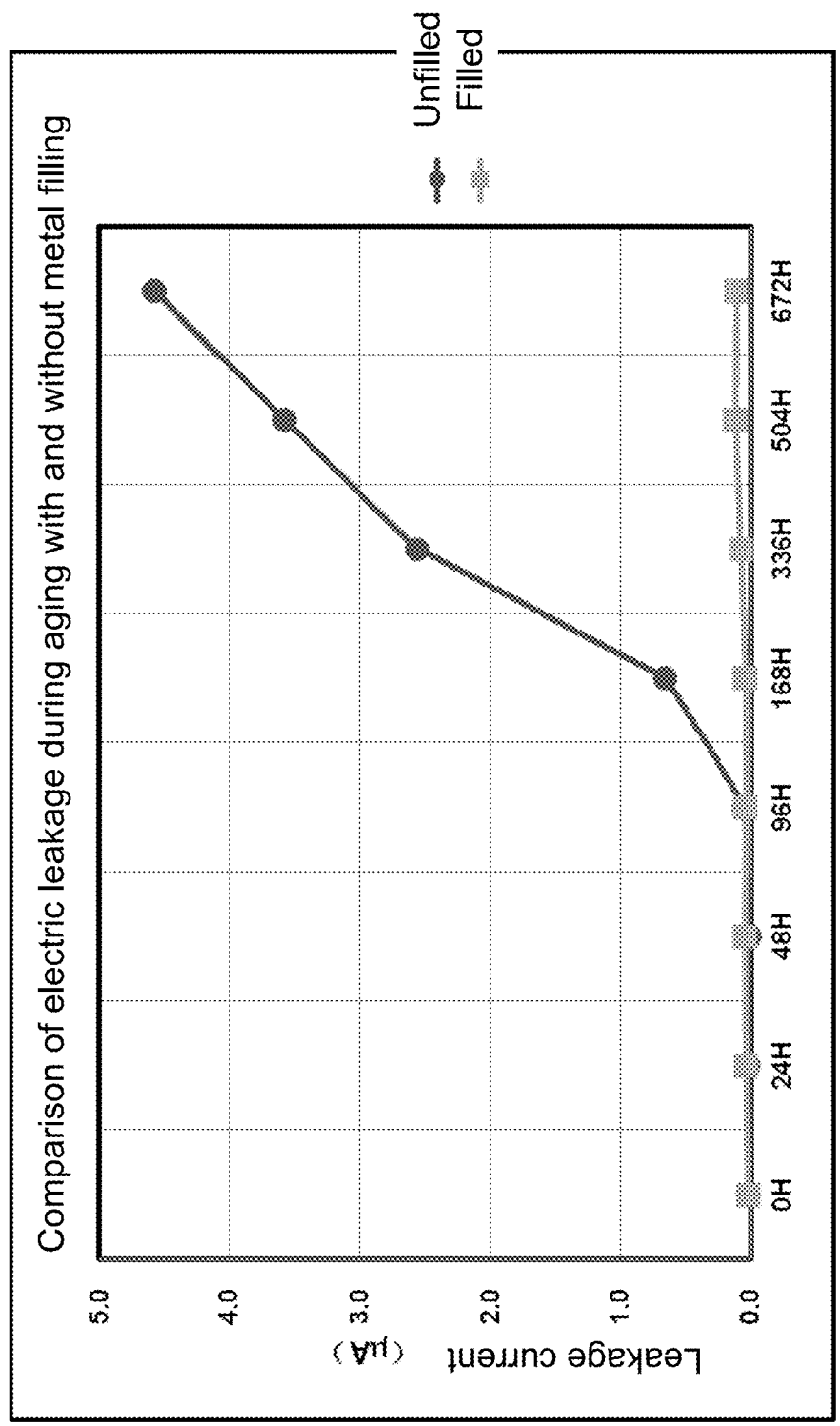
FIG. 12 is comparison of electric leakage during aging of chips fabricated according to this present disclosure and those from conventional methods.

Two batches of samples are fabricated. In one batch, the deflected dislocation is filled with electromigration resistant metal, and in the other batch, the deflected dislocation is not filled with electromigration resistant metal. Each batch has six samples and is placed in high temperature (80° C.) and high current (700 mA) condition for quick aging. After 672 hours of aging, calculate average electric leakage and the results are as shown in FIG. 12. For the samples with metal filled into the deflected dislocation, the leaked current is within 0.1 A and for the other batch, the leaked current is approximate to 5 A, which is 50 times of that of the samples with anti-leakage process. It is certified that this embodiment can greatly reduce electric leakage due to aging.

Embodiment 2

Figure 13:
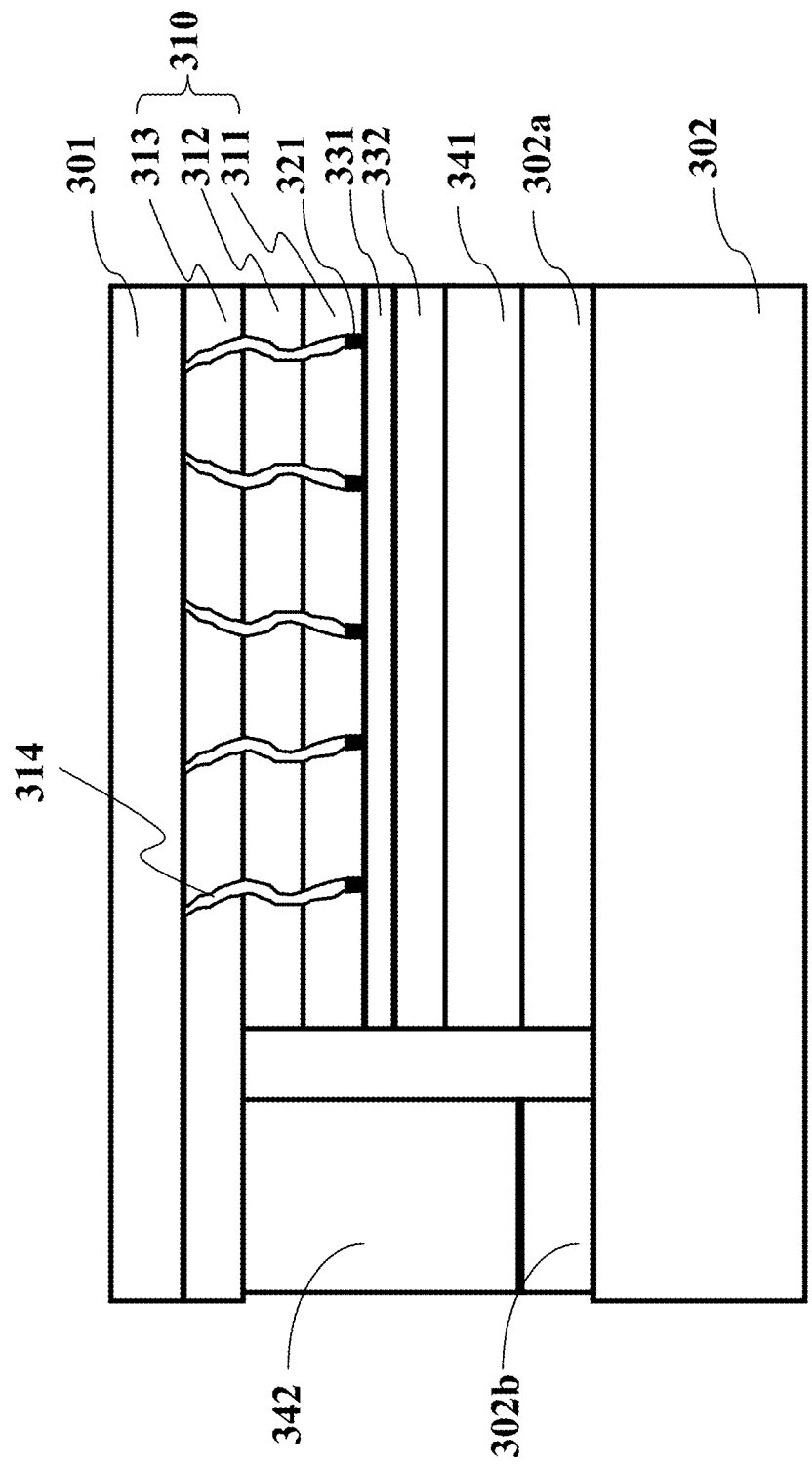
FIG. 13 is a structural section view according to Embodiment 2 of the present disclosure.

This embodiment is a flip-chip LED light-emitting device. With reference to FIG. 13, a flip-chip LED light-emitting device is provided, comprising: a sapphire substrate 301; a GaN semiconductor epitaxial laminated layer 310 over the sapphire substrate 301, comprising: an N-type semiconductor layer 313, a light-emitting layer 312 and a P-type semiconductor layer 311, in which, a series of deflected dislocations 314 penetrate the entire semiconductor epitaxial laminated layer 310; electromigration resistant metal 321 filled into the deflected dislocation over the P-type semiconductor layer 311; a bonding layer 331 over the P-type semiconductor layer 311; a mirror layer 332 over the bonding layer 331; a P electrode 341 over the mirror layer 332, an N electrode 342 over the N-type semiconductor layer 313; and a conductive substrate 302, having a P and an N welding point (generally, metal layer); and a P electrode 341 and an N electrode 342, of same height, corresponding to the P and N welding points over the conductive substrate 302 respectively, thus forming a flip-chip LED light-emitting device.

Embodiment 3

Figure 14:
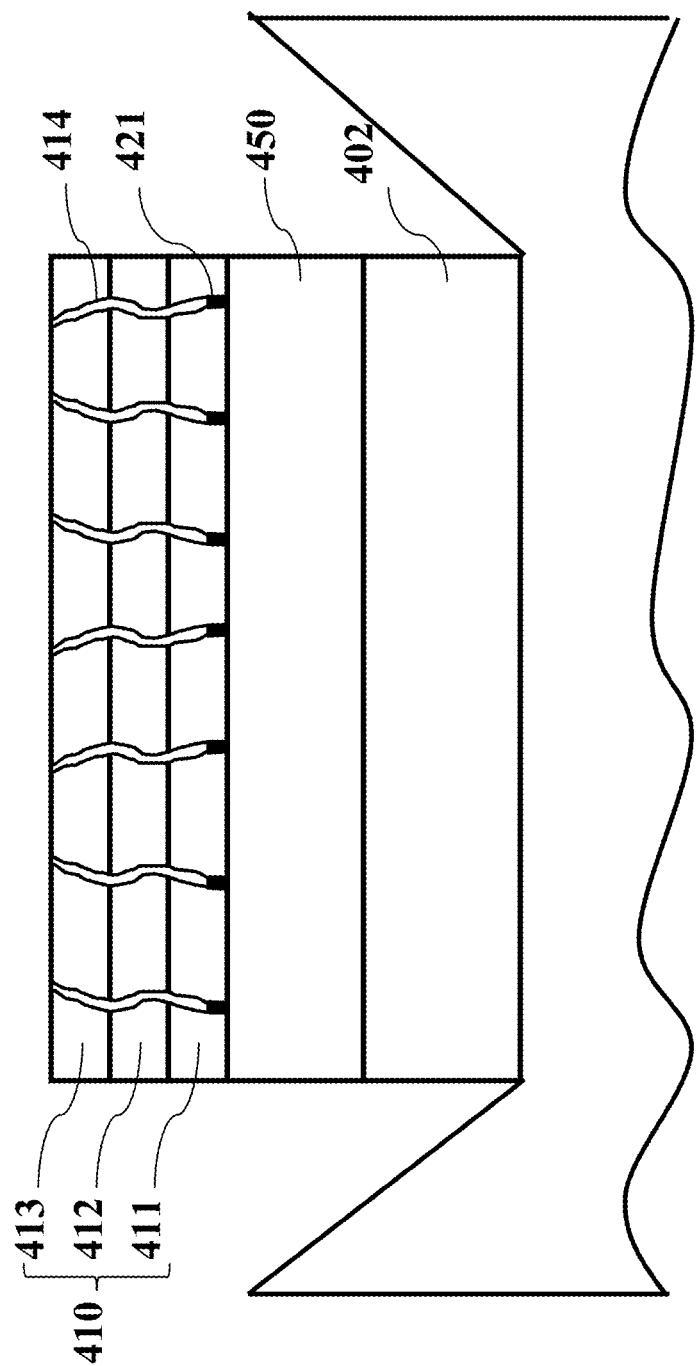
FIG. 14 is a structural section view according to Embodiment 3 of the present disclosure.
Figure 15:
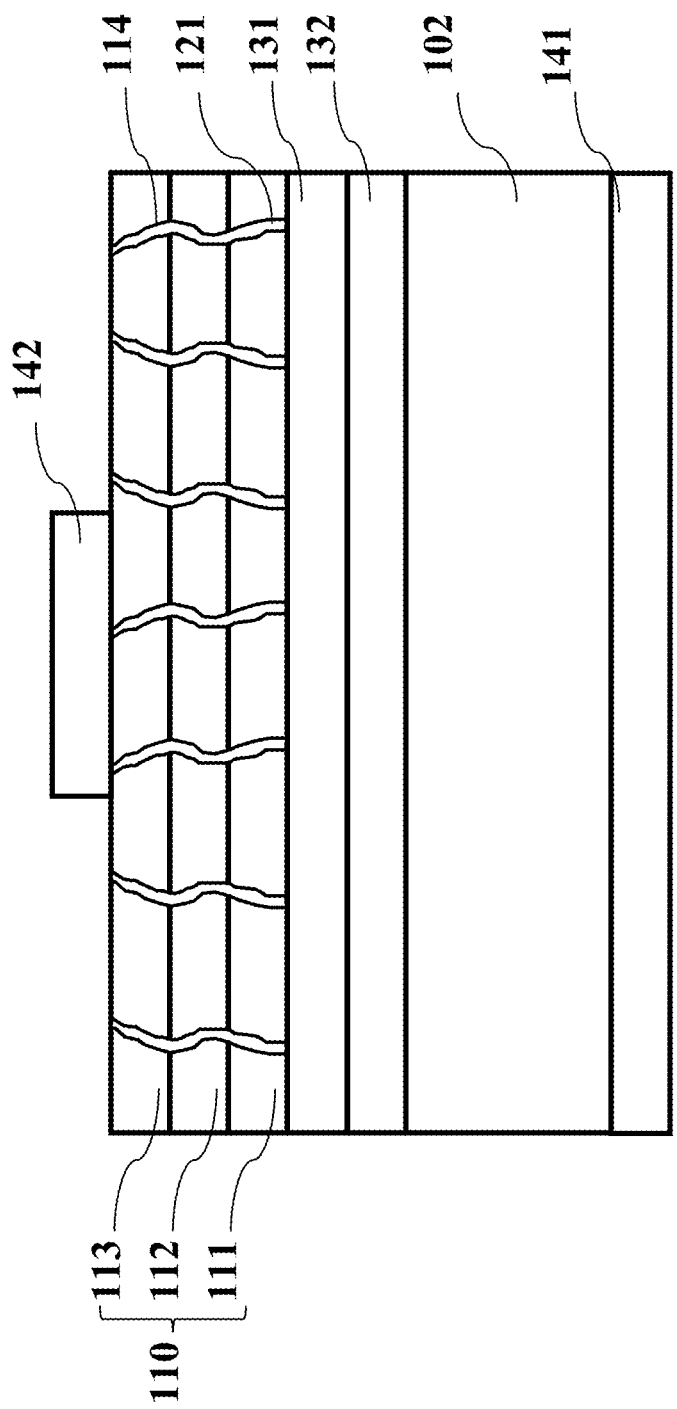
FIG. 15 is a structural section view of a common vertical LED light-emitting device.

In the LED light-emitting device, a solder layer can be used to connect the chip to a base and the solder layer generally comprises easy-migrating metal material, like Sn. With reference to FIG. 14, the LED chip is fabricated over a base 402 through a solder layer 450, in which, the LED chip comprises: a semiconductor epitaxial laminated layer 410, which comprises a P-type semiconductor layer 411, a light-emitting layer 412 and an N-type semiconductor layer 413 having the deflected dislocation 414 inside; and electromigration resistant metal 421 is filled into the deflected dislocation over the P-type semiconductor layer 411. The LED chip may also comprise other structural layers, e.g., reflective layer, current spreading layer, which is not shown in this embodiment. The solder layer 430 is generally a multi-layer structure made of Ti, Al, Ni, Cr, Sn or alloy from any of their combinations.

In Embodiments 2 and 3, electromigration resistant metal is filled into the deflected dislocation of the contact surface between the semiconductor epitaxial laminated layer and the metal material layer, the fabrication method of which can be referred to Embodiment 1, which effectively inhibits easy-electromigration metal (e.g., Ag, Al, Sn) in the metal material layer from migrating towards the epitaxial layer, thus forming a high-reliability light-emitting device that prevents electric leakage.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting device, comprising:
   a semiconductor epitaxial laminated layer that comprises an N-type semiconductor layer, a P-type semiconductor layer, and a light-emitting layer between the N-type semiconductor layer and the P-type semiconductor layer, wherein the semiconductor epitaxial laminated layer has a surface with deflected dislocations; and
   an electromigration resistant metal filled into deflected dislocations at the N-type or/and P-type semiconductor layer surface through pretreatment to block an electromigration channel formed over the semiconductor epitaxial laminated layer due to the deflected dislocations to thereby reduce leakage current, wherein the electromigration resistant metal is only located in the deflected dislocations at the semiconductor epitaxial laminated layer surface to optimally reduce light absorption.

2. The light-emitting device of claim 1, wherein the electromigration resistant metal is filled into the deflected dislocations at the semiconductor epitaxial laminated layer surface to increase adhesiveness of the semiconductor epitaxial laminated layer to the metal material layer.

3. The light-emitting device of claim 1, wherein the electromigration resistant metal is filled into at least one surface of the N-type or the P-type semiconductor layer, but does not penetrate the semiconductor epitaxial laminated layer entirely.

4. The light-emitting device of claim 1, wherein the electromigration resistant metal is filled into the deflected dislocations at the N-type or/and the P-type semiconductor layer surface by applying voltage or heating.

5. The light-emitting device of claim 1, wherein the electromigration resistant metal comprises at least one of Cu, Au, Pt, Pd, W, Mo, Ta, Nb, or V, or an alloy from a combination thereof.

6. The light-emitting device of claim 1, wherein a reflective mirror layer is formed over the semiconductor epitaxial laminated layer through a bonding layer, and the deflected dislocations at the surface of the semiconductor epitaxial laminated layer at a side that is adjacent to the reflective mirror layer is filled with the electromigration resistant metal.

7. The light-emitting device of claim 6, wherein the reflective mirror layer comprises at least one of Ag, Al, or an alloy thereof.

8. The light-emitting device of claim 1, further comprising a solder layer configured to bond the semiconductor epitaxial laminated layer to a base, wherein the deflected dislocations at the surface of the semiconductor epitaxial laminated layer at a side that is adjacent to the solder layer is filled with the electromigration resistant metal.

9. The light-emitting device of claim 8, wherein the solder layer is made of Ti, Al, Ni, Cr, or Sn, or an alloy from a combination thereof.

10. The light-emitting device of claim 1, wherein the light-emitting device has a vertical structure or a flip-chip structure.

11. A method of fabricating a light-emitting device, the method comprising:
   Step 1, a semiconductor epitaxial laminated layer is provided, comprising an N-type semiconductor layer, a P-type semiconductor layer, and a light-emitting layer between the N-type semiconductor layer and the P-type semiconductor layer, wherein the semiconductor epitaxial laminated layer has a surface with deflected dislocations;
   Step 2, an electromigration resistant metal is filled into the deflected dislocations at the N-type or/and P-type semiconductor layer surface through pretreatment to block an electromigration channel formed over the semiconductor epitaxial laminated layer due to deflected dislocations to reduce leakage current,
   wherein in the Step 2, the electromigration resistant metal is diffused to the deflected dislocations at the semiconductor epitaxial laminated layer surface by applying a voltage to both ends of the semiconductor epitaxial laminated layer.

12. The method of claim 11, wherein in Step 2, the electromigration resistant metal is filled into the deflected dislocations at the semiconductor epitaxial laminated layer surface through heating and fusing.

13. The method of claim 12, wherein the heating and fusing is at a temperature higher than 400° C.

14. The method of claim 11, wherein the voltage is higher than 100 V.

15. A method of fabricating a light-emitting device, the method comprising:
- Step 1, a semiconductor epitaxial laminated layer is provided, comprising an N-type semiconductor layer, a P-type semiconductor layer, and a light-emitting layer between the N-type semiconductor layer and the P-type semiconductor layer, wherein the semiconductor epitaxial laminated layer has a surface with deflected dislocations;
- Step 2, an electromigration resistant metal is filled into the deflected dislocations at the N-type or/and P-type semiconductor layer surface through pretreatment to block an electromigration channel formed over the semiconductor epitaxial laminated layer due to deflected dislocations to reduce leakage current,
- wherein the Step 2 comprises:
    - exposing at least one surface of the N-type or the P-type semiconductor layer of the semiconductor epitaxial laminated layer, and forming an electromigration resistant metal blocking layer over the exposed surface;
    - applying an action over the metal blocking layer to fill the electromigration resistant metal of the metal blocking layer into the deflected dislocations of the semiconductor epitaxial laminated layer surface; and
    - removing the metal blocking layer and retaining the electromigration resistant metal in the deflected dislocations and exposing the semiconductor epitaxial laminated layer surface.

16. The method of claim 15, wherein the metal blocking layer is formed through evaporating, sputtering, vapor deposition, or a combination thereof.

17. The method of claim 15, wherein the metal blocking layer is removed through dry or wet etching.

18. The method of claim 17, wherein a metal etching fluid is applied in a wet etching till the semiconductor epitaxial laminated layer surface is just exposed yet the electromigration resistant metal in the deflected dislocations is retained.

* * * * *